(12) United States Patent
Hickman et al.

(10) Patent No.: US 9,870,435 B1
(45) Date of Patent: *Jan. 16, 2018

(54) USE OF PHYSICAL DEFORMATION DURING SCANNING OF AN OBJECT TO GENERATE VIEWS OF THE OBJECT

(71) Applicant: Google Inc., Mountain View, CA (US)

(72) Inventors: Ryan Hickman, Mountain View, CA (US); Arshan Poursohi, Berkeley, CA (US); Thor Lewis, San Francisco, CA (US)

(73) Assignee: Google LLC, Mountain View, CA (US)

( * ) Notice: Subject to any disclaimer, the term of this patent is extended or adjusted under 35 U.S.C. 154(b) by 990 days.

This patent is subject to a terminal disclaimer.

(21) Appl. No.: 14/195,475

(22) Filed: Mar. 3, 2014

Related U.S. Application Data

(62) Division of application No. 13/603,359, filed on Sep. 4, 2012, now Pat. No. 8,712,737.

(60) Provisional application No. 61/674,056, filed on Jul. 20, 2012.

(51) Int. Cl.
*G06F 17/50* (2006.01)
(52) U.S. Cl.
CPC .................................... *G06F 17/50* (2013.01)
(58) Field of Classification Search
CPC ........................................................ G06F 17/50
USPC ............................................................. 703/1
See application file for complete search history.

(56) References Cited

U.S. PATENT DOCUMENTS

| | | | |
|---|---|---|---|
| 6,662,148 B1 | 12/2003 | Adler et al. | |
| 6,664,956 B1 | 12/2003 | Erdem | |
| 6,714,901 B1 | 3/2004 | Cotin et al. | |
| 6,989,834 B2 | 1/2006 | Ostermann | |
| 7,024,344 B1 | 4/2006 | Nishi | |
| 7,184,047 B1 | 2/2007 | Crampton | |
| 7,275,023 B2 | 9/2007 | Chen et al. | |
| 7,373,284 B2 | 5/2008 | Stabelfeldt et al. | |
| 7,493,243 B2 | 2/2009 | Choi et al. | |
| 7,512,255 B2 | 3/2009 | Kakadiaris et al. | |

(Continued)

OTHER PUBLICATIONS

Autodesk 123D Catch, Catch and carry, Turn ordinary photos into extraordinary 3D models, www.123dapp.com/catch, 2013.

(Continued)

*Primary Examiner* — Saif A Alhija
(74) *Attorney, Agent, or Firm* — McDonnell Boehnen Hulbert & Berghoff LLP

(57) ABSTRACT

Disclosed are methods and systems for determining and displaying a simulated deformation of a 3D object data model. In one aspect, a method is disclosed that includes causing a force to be applied to an object to cause a deformation of the object and causing a plurality of reference scans of the object to be captured. The method further includes, based on the plurality of reference scans, generating a 3D object data model representing the object and, further based on the plurality of reference scans, identifying a constraint point of the 3D object data model, where the constraint point represents a point of minimum deformation of the object. The method still further includes selecting a predefined deformation model, where the predefined deformation model defines a simulated deformation, and where the simulated deformation simulates at least a portion of the deformation of the object proximate to the point of minimum deformation.

19 Claims, 13 Drawing Sheets

(56) References Cited

U.S. PATENT DOCUMENTS

| | | | |
|---|---|---|---|
| 7,937,253 B2 | 5/2011 | Anast et al. | |
| 2001/0026897 A1* | 10/2001 | Shima | G03F 7/70358 430/22 |
| 2005/0267614 A1 | 12/2005 | Looney et al. | |
| 2005/0267615 A1 | 12/2005 | Lavash et al. | |

OTHER PUBLICATIONS

Bickel et al. "Design and Fabrication of Materials with Desired Deformation Behavior" ACM Transactions on Graphics, vol. 29, No. 4, Article 63 (Jul. 2010).
Yu "A CAE-Integrated Distributed Collaborative Design System for Finite Element Analysis of Complex Product based on SOOA", Advances in Engineering Software 41 (Dec. 2009) 590-603.
Ferrant et al. "Serial registration of intraoperative MR images of the brain", Medical Image Analysis 6 (Jan. 2002) 337-359.
Amberg et al. "Optimal Step Nonrigid ICP Algorithms for Surface Registration", IEEE CVPR (Jun. 2007).
Zhang et al. "From Range Data to Animated Anatomy-Based Faces: A Model Adaptation Method", IEEE5th International Conference on 3-D Digital imaging and Modeling (Jun. 2005).
Lepetit et al. "Monocular Model-Based 3D Tracking of Rigid Objects: A Survey", Foundations and Trends in Computer Graphics and Vision vol. 1, No. 1 (Aug. 2005).
Wang, "Definition and Review of Virtual Prototyping", J. Comp. Inf. Sci. Eng. (Jan. 2002).
Choi et al. "A virtual prototyping system for rapid product development", Computer-Aided Design 36 (Apr. 2004) 401-412.

\* cited by examiner

USE OF PHYSICAL DEFORMATION DURING SCANNING OF AN OBJECT TO GENERATE VIEWS OF THE OBJECT

CROSS-REFERENCE TO RELATED APPLICATIONS

This application claims the benefit of U.S. patent application Ser. No. 13/603,359 filed on Sep. 4, 2012, which claims priority to U.S. Provisional Application No. 61/674,056 filed on Jul. 20, 2012. The entirety of each of U.S. patent application Ser. No. 13/603,359 and U.S. Provisional Application No. 61/674,056 is herein incorporated by reference.

BACKGROUND

Three-dimensional (3D) scanning and digitization have many applications in a number of industries and services. For example, products may be scanned and digitized in order to ensure conformity of product shape and product measurement in industrial production systems. As another example, prototypes may be scanned and digitized to assist with design and stylizing in industrial design. As still other examples, complex parts may be scanned and digitized for the purpose of reverse engineering, objects may be scanned and digitized to allow interactive visualization in multimedia applications, and artwork and artifacts may be scanned and digitized to create 3D documentation of such works. Other applications of 3D scanning and digitization exist as well.

A number of 3D scanning and digitization techniques exist, including, for example, structured light illumination techniques, x-ray, ultrasound, and magnetic resonance stimulus techniques, and video processing techniques. Each of these techniques typically includes capturing incremental data from an object, deriving 3D data from the captured incremental data, and registering the incremental data to a common 3D coordinate system, resulting in a 3D object data model of the scanned object.

SUMMARY

Disclosed are methods and systems for determining simulated deformation of three-dimensional (3D) object data models by deforming objects during scanning. Also disclosed are methods and systems for displaying a simulated deformation of a 3D object data model.

In one example, a method is disclosed that includes causing a force to be applied to an object to cause a deformation of the object and, during the deformation of the object, causing a plurality of reference scans of the object to be captured. The method further includes, based on the plurality of reference scans, determining a 3D object data model representing the object and, further based on the plurality of reference scans, identifying a constraint point of the 3D object data model, where the constraint point represents a point substantially of minimum deformation of the object. The method still further includes associating a predefined deformation model with the constraint point, where the predefined deformation model defines a simulated deformation, and where the simulated deformation simulates at least a portion of the deformation of the object proximate to the point substantially of minimum deformation.

In another example, a method is disclosed that includes providing a database of three-dimensional (3D) object data models and, for each of the 3D object data models, maintaining one or more force models, where each of the one or more force models comprises information indicative of (i) a force, (ii) a constraint point of the 3D object data model, and (iii) a predefined deformation model, where the predefined deformation model defines simulated deformation of the 3D object data model proximate to the constraint point. The method further includes receiving a request to generate a simulated deformation of a given 3D object data model from the database of 3D object data models using a given force and selecting from the one or more force models for the given 3D object data model at least one force model that comprises information indicative of the given force. The method still further includes generating the simulated deformation of the given 3D object data model, where the simulated deformation is generated using the at least one selected force model.

In yet another example, an article of manufacture is disclosed that includes a computer-readable medium, having stored therein program instructions that, upon execution by a computing device, cause the computing device to perform the functions of the example method described above.

In yet another example, a computer-based system is disclosed that includes a web-based interface, at least one processor, and data storage. The data storage comprises one or more force models for a 3D object data model, where each of the one or more force models comprises information indicative of (a) a force, (b) a constraint point of the 3D object data model, and (c) a predefined deformation model, where the predefined deformation model defines simulated deformation of the 3D object data model proximate to the constraint point. The data storage further comprises instructions executable by the at least one processor to (a) receive, via the web-based interface, a request to generate a simulated deformation of a given 3D object data model using a given force, (b) in response to receiving the request to generate the simulated deformation of the given 3D object data model using the given force, select at least one force model from the one or more force models that comprises information indicative of the given force, and (c) generate, via the web-based interface, the simulated deformation of the 3D object data model, where the simulated deformation is generated using the at least one selected force model.

The foregoing summary is illustrative only and is not intended to be in any way limiting. In addition to the illustrative aspects, embodiments, and features described above, further aspects, embodiments, and features will become apparent by reference to the figures and the following detailed description.

DETAILED DESCRIPTION

The following detailed description includes references to the accompanying figures. In the figures, similar symbols typically identify similar components, unless context dictates otherwise. The example embodiments described in the detailed description, figures, and claims are not meant to be limiting. Other embodiments may be utilized, and other changes may be made, without departing from the scope of the subject matter presented herein. It will be readily understood that the aspects of the present disclosure, as generally described herein and illustrated in the figures can be arranged, substituted, combined, separated, and designed in a wide variety of different configurations, all of which are contemplated herein.

In some cases, it may be desirable to view how an object represented by a 3D object data model would be deformed (e.g., would move, would change shape, etc.) when a force is applied to the object. To this end, it may be desirable to define a simulated deformation of a 3D object data model. Further, it may be desirable to generate the simulated deformation of the 3D object data model.

In order to define the simulated deformation of the 3D object data model, a force may be applied to an object, causing deformation of the object and, while the object is deformed, a plurality of reference scans may be captured of the object. Based on the reference scans, a three-dimensional (3D) object data model representing the object may be generated. Further based on the reference scans, a constraint point of the 3D object data model may be identified. The constraint point may represent a point substantially of minimum deformation (e.g., minimum movement, minimum shape change, etc.) of the object. A predefined deformation model may then be selected for and associated with the cotraint point. The predefined deformation model may define the simulated deformation. The simulated deformation may simulate at least a portion of the deformation of the object proximate to the point substantially of minimum deformation. Information indicative of the force, the constraint point, and the predefined deformation model may be stored together in a force model. The force model may be associated with the 3D object data model in a 3D object data model database.

In order to generate the simulated deformation of the 3D object data model using the force, the force model may be accessed. The simulated deformation of the 3D object data model may then be generated using the predefined deformation model indicated in the force model.

Figure 1A:
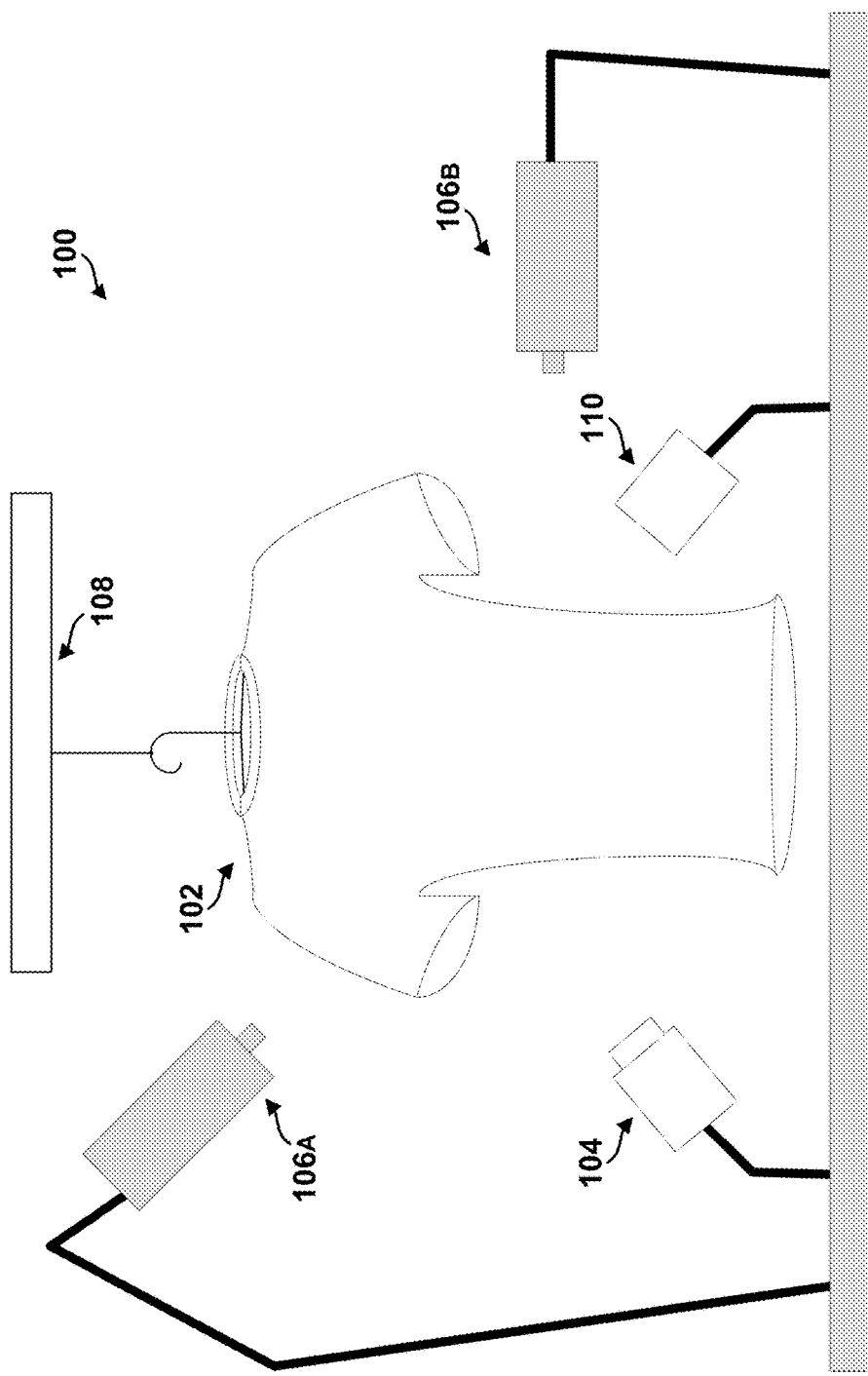
FIGS. 1A-B illustrate an example three-dimensional (3D) scanning (1A) and digitization (1B) system for defining a simulated deformation of a 3D object data model, in accordance with embodiments described herein.
Figure 1B:
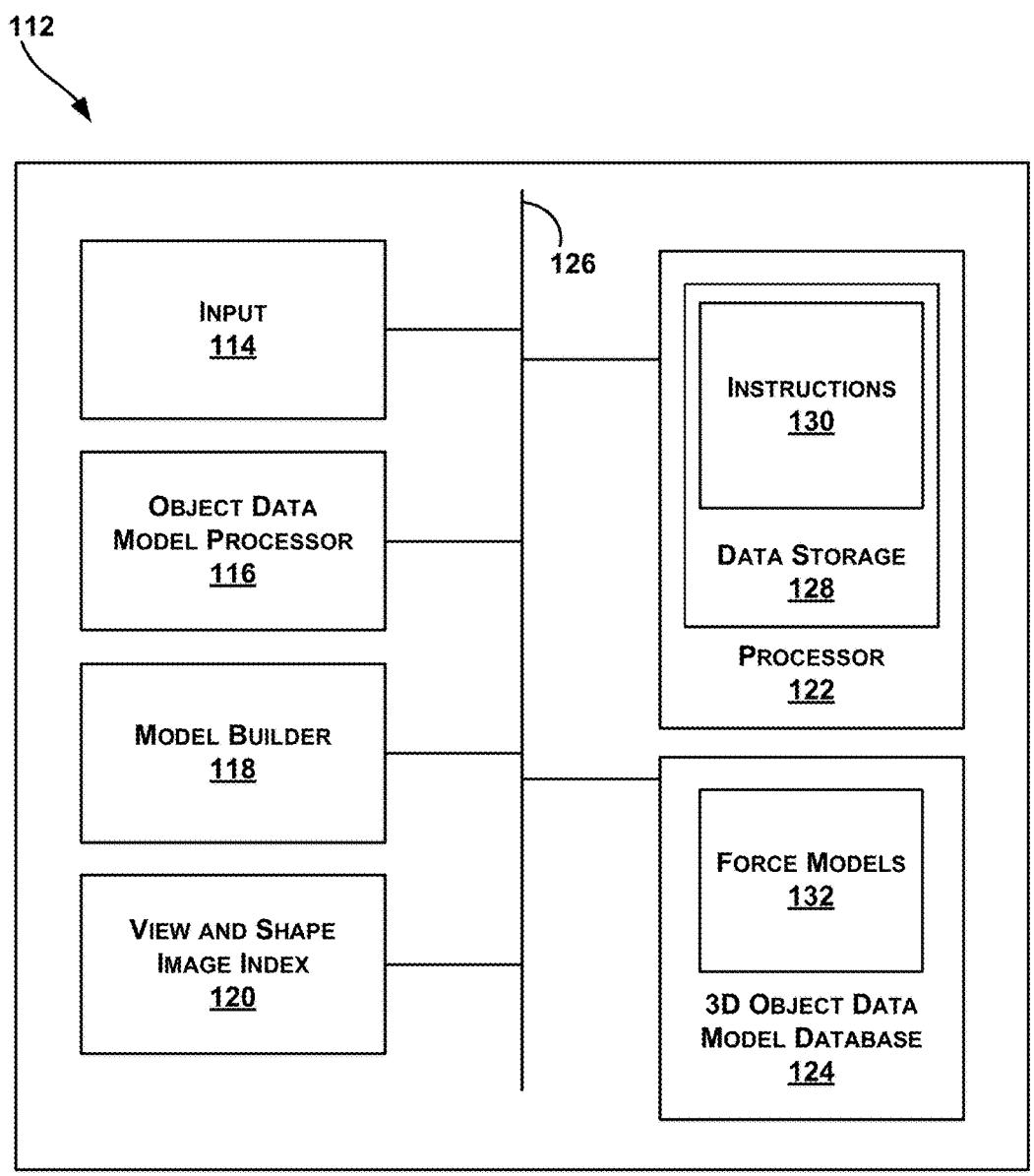

FIGS. 1A and 1B illustrate an example three-dimensional (3D) scanning and digitization system, respectively, for defining a simulated deformation of a 3D object data model, in accordance with embodiments described herein. In particular, as shown in FIG. 1A, an example 3D scanning system 100 may be used to scan an object 102. While the object 102 is shown to be a shirt, it will be understood that the object 102 may take other forms as well.

For purposes of illustration, the 3D scanning system 100 is shown to be configured for a structured light illumination technique. However, it will be understood that the 3D scanning system 100 may be configured for other 3D scanning techniques as well. As shown, the 3D scanning system 100 includes a projector 104 and two cameras 106A, 106B. While one projector 104 and two cameras 106A, 106B are shown, more or fewer projectors and cameras are possible as well. Further, while the projector 104 and the cameras 106A, 106B are shown to be positioned in particular locations in the 3D scanning system 100, other locations are possible as well.

The projector 104 may be configured to project a pattern of structured light onto the object 102. The pattern may be, for example, a pattern of parallel lines or a checkerboard. Other patterns are possible as well. The cameras 106A, 106B may be configured to detect reflections of the pattern of structured light off the object 102. To this end, the cameras 106A, 106B may be, for example, monochrome stereo cameras. Other cameras are possible as well.

Because the object 102 has a non-uniform surface, the reflections of the pattern of structured light will be distorted. The non-uniform surface of the object 102 may be estimated from the distortions in the reflections of the pattern of structured light. The pattern of structured light may comprise, for example, infrared light, or light of another wavelength.

As shown, the 3D scanning system 100 further includes a platform 108 that is configured to hold the object 102. While the platform 108 is shown to have a particular shape and size, other shapes and sizes are possible as well. For example, in some embodiments the platform 108 may take the form of a mannequin on which the object 102 is positioned. Other examples are possible as well. Further, while the platform 108 is shown to be located above the object 102, in other embodiments the platform 108 may be located below, between, within, or otherwise relative to the object 102. Further, while the object 102 is shown to be hung from the platform 108, in other embodiments the object 102 may be on top of or over the platform 108 (e.g., in embodiments where the platform 108 takes the form of a mannequin, the object 102 may be "worn" by the platform 108). Other configurations of the platform 108 and the object 102 are possible as well. In some embodiments, no platform 108 may be included in the 3D scanning system 100.

As shown, the 3D scanning system 100 still further includes a force generator 110. The force generator 110 may be configured to apply a force to the object 102 to cause a deformation of the object 102. The force and the deformation may each take a number of forms.

In some embodiments, the force may include a linear force. To this end, the force may take the form of, for example, pressurized air, a physical motion, such as a push, a bounce, or a slide, a physical compression, or a physical tension. Alternatively or additionally, in some embodiments, the force may include a centrifugal force. To this end, the force may take the form of, for example, pressurized air or a physical motion, such as a spin, a shake, or a twist. The force may be a constant force or may vary with time. Other forces are possible as well.

In any case, the force may cause a deformation of the object. In some embodiments the deformation may include, for example, a movement of the object (e.g., a translation or rotation of the object) or a portion thereof. Alternatively or additionally, in some embodiments, the deformation may include a change in the shape of the object (e.g., an angulation or warp of the object) or a portion thereof. In some embodiments, the force may be selected to cause a deformation that is common for a particular object. For example, for a shirt, the deformation may be flowing on a moving torso or blowing in the wind. Other examples include crushing of a plastic cup, flexing of a shoe by a human foot, stretching of headphones over a human head, squishing of a mattress by a human body, and so on. The deformation may be constant or may vary with time. Other deformations are possible as well.

The force generator 110 may also take a number of forms. In some embodiments, including that shown in FIG. 1A, the force generator 110 may be positioned in the 3D scanning system 100 to apply a force to the object 102. While the force generator 110 is shown to be positioned below and to the right of the object 102, the force generator 110 may be positioned elsewhere in the 3D scanning system 100 as well. For example, the force generator 110 may be positioned directly below the object 102. In embodiments where the object 102 is a shirt, this may allow the force generator 110 to apply the force up into the object 102. Other examples are possible as well. In some embodiments, the position of the force generator 110 may be modified while the force is applied. Further, while the force generator 110 is shown to be positioned at a distance from the object 102, in some embodiments the force generator 110 may be in contact with (or may come into contact with) the object 102.

While the force generator 110 is shown as a pressurized air generator, the force generator 110 may take other forms, such as an actuator or actuators configured to apply a physical motion (e.g., a push, a bounce, a slide, spin, a shake, or a twist), a physical compression, or a physical tension to the object 102. Further, while the force generator 110 is shown to be separate from the platform 108, the force generator 110 may be included in the platform 108, such that the platform 108 is configured to apply a force to the object 102. Alternatively, in some embodiments, no force generator 110 may be included, and the force may be applied by a user (not shown) of the 3D scanning system 100. Other forces and force generators are possible as well.

While the force is applied to the object 102, causing a deformation of the object 102, a plurality of reference scans may be captured. To this end, the projector 104 may project the pattern of structured light onto the object 102 and the cameras 106A, 106B may detect reflections of the pattern of structured light off the object 102, as described above. The reference scans may be determined based on the reflections of the pattern of structured light.

In some embodiments, the plurality of reference scans may include at least one reference scan captured before the force is applied to the object 102 and at least one reference scan after the force is applied to the object 102. That is, the plurality of reference scans may include at least one reference scan of the object 102 before it is deformed and at least one reference scan of the object 102 while the object 102 is being deformed and/or after the object 102 has been deformed. In this manner, the plurality of reference scans may capture a continuous (e.g., as opposed to an instant) deformation of the object 102 caused by the applied force.

The 3D scanning system 100 may alternatively or additionally include elements other than those shown.

The plurality of reference scans may be used to determine 3D scanning data representing the object 102. The 3D scanning data may then be used to generated a 3D object data model representing the object 102 may be generated. The generation of the 3D object data model may be referred to as 3D digitization.

In some embodiments, the 3D scanning system 100 may be configured to generate the 3D object data model using the 3D scanning data, such that the 3D scanning system 100 also includes a 3D digitization system. Alternatively, the 3D scanning system 100 may be configured to transmit the 3D scanning data to a separate 3D digitization system for generation of the 3D object data model representing the object 102. The 3D digitization system may, for example, take the form of the 3D digitization system shown in FIG. 1B.

FIG. 1B shows a block diagram of an example 3D digitization system 112 for defining a simulated deformation of a 3D object data model. The 3D digitization system 112 may be integrated with or communicatively coupled to the 3D scanning system 100 shown in FIG. 1A. Further, the 3D digitization system 112 may be co-located with or remote from the 3D scanning system 100 shown in FIG. 1A. The 3D digitization system 112 may take the form of a computing device, such as a personal computer, tablet computer, or server. The 3D digitization system 112 may take other forms as well.

As shown, the 3D digitization system 112 includes an input 114, an object data model processor 116, a model builder 118, a view and shape image index 120, a processor 122, and an object data model database 124, all of which may be communicatively linked together by a system bus, network, and/or other connection mechanism 126.

The input 114 may be configured to wirelessly communicate with a 3D scanning system, such as the 3D scanning system 100 described above. In particular, the input 114 may be configured to receive from the 3D scanning system 100 3D scanning data of an object collected by the 3D scanning system. The 3D scanning system 100 may be operated by the same entity (e.g., vendor or manufacturer) as the 3D digitization system 112, or may be operated by a separate entity. In embodiments where the 3D digitization system 112 is integrated with the 3D scanning system 100, the input 114 may be omitted.

The input 114 may include an antenna and a chipset for communicating with the 3D scanning system over an air interface. The chipset or input 114 in general may be arranged to communicate according to one or more other types of wireless communication (e.g. protocols) such as Bluetooth, communication protocols described in IEEE 802.11 (including any IEEE 802.11 revisions), cellular technology (such as GSM, CDMA, UMTS, EV-DO, WiMAX, or LTE), or Zigbee, among other possibilities. In some embodiments, the input 114 may also be configured to wirelessly communicate with one or more other devices and systems, such as a server, a database, and/or other systems.

The object data model processor 116 may be configured to generate a mesh using the 3D scanning data received from the 3D scanning system. The mesh may be, for example, a triangulated or other polygonal mesh. In some embodiments, prior to generating the mesh, the object data model processor 116 may decimate the 3D scanning data (e.g., from 5 million to 120,000 surfaces) utilizing texture-preserving decimation.

This may allow the object data model processor 116 to reduce a file size of the mesh. The object data model processor 116 may generate the mesh in other manners as well.

The model builder 112 may be configured to generate a 3D object data model representing the object using the mesh generated by the object data model processor 116. Alternatively, in some embodiments the model builder 112 may generate the 3D object data model representing the object using the 3D scanning data received from the 3D scanning system. In these embodiments, the 3D scanning data received from the 3D scanning system may include a data set defining a mesh image of the object, and the model builder 118 may use the data set defining the mesh image along with the 3D scanning data to generate the 3D object data model representing the object. The model builder 112 may generate the 3D object data model representing the object in other manners as well.

In some embodiments, the 3D digitization system 112 may receive 3D scanning data corresponding to multiple views of the same object. In these embodiments, the object data model processor 116 may be configured to generate meshes of the object from each of the multiple views. The view and shape image index 120 may be configured to index the meshes of the object from each of the multiple views.

The processor 122 may comprise one or more general-purpose processors and/or one or more special-purpose processors. To the extent the processor 122 includes more than one processor, such processors could work separately or in combination.

Data storage 128, in turn, may comprise one or more volatile and/or one or more non-volatile storage components, such as optical, magnetic, and/or organic storage, and data storage 128 may be integrated in whole or in part with the processor 122. As shown, data storage 128 may contain instructions 130 (e.g., program logic) executable by the processor 122 to execute various system functions. In particular, the instructions 130 may be executable by the processor 122 to determine simulated deformation of the 3D object data model.

To this end, the instructions 130 may be executable by the processor 122 to identify, based on the plurality of reference scans, a constraint point of the 3D object data model. The constraint point may represent a point substantially of minimum deformation of the object represented by the 3D object data model. Further, the instructions 130 may be executable by the processor 122 to associate a predefined deformation model with the constraint point (e.g., by selecting the predefined deformation model from a plurality of predefined deformation models stored in the data storage 128 and/or otherwise accessible by the 3D digitization system 112). The predefined deformation model may, for example, be predefined by deforming an object while obtaining reference scans of the object, as described above, and determining the predefined deformation model based on the reference scans. Further, the predefined deformation model may define a simulated deformation. The simulated deformation may simulate at least a portion of the deformation of the object proximate to the point substantially of minimum deformation. Still further, the instructions 130 may be executable by the processor 122 to generate a force model for the 3D object data model. The force model may comprise information indicative of the force applied to the object, information indicative of the constraint point, and information indicative of the predefined deformation model associated with the constraint point. The force model may be stored with other force models 132 in the 3D object data model database 124.

The realities of modern devices and the methods of their production are not absolutes, but rather statistical efforts to produce a desired device and/or result. Even with the utmost of attention being paid to repeatability of processes, operation of manufacturing facilities, the nature of starting and processing materials, and so forth, variations and imperfections result. Accordingly, no limitation in the description of the present disclosure or its claims can or should be read as absolute. To further highlight this, the term "substantially" may occasionally be used herein. While as difficult to precisely define as the limitations of the present disclosure themselves, we intend that this term be interpreted as "to a large extent", "as nearly as practicable", "within technical limitations", and the like.

The 3D object data model database 124 may include a number of 3D object data models generated by the model builder 118. For each 3D object data model, the 3D object data model database 124 may additionally store the 3D scanning data, mesh, and/or data set defining the mesh used to generate the 3D object data model. In embodiments where the 3D digitization system 112 receives 3D scanning data corresponding to multiple views of the same object, and the object data model processor 116 generates meshes of the object from each of the multiple views, the meshes may be indexed in the 3D object data model database 124, as described above.

For each 3D object data model, the 3D object data model database 124 may additionally include one or more force models 132 determined by the instructions 130, as described above. Each force model 132 may include information indicative of a force applied to the object represented by the 3D object data model, information indicative of a constraint point of the 3D object data model, and information indicative of a predefined deformation model associated with the constraint point.

In some embodiments, one or more of the object data model processor 116, the model builder 118, the view and shape image index 120, and the instructions 130 may be included in the 3D scanning system (e.g., the 3D scanning system 100 shown in FIG. 1A) rather than in the 3D digitization system 112. In these embodiments, the functionality of these elements (e.g., decimating the 3D scanning data, generating meshes, generating 3D object data models, indexing meshes, identifying constraint points, associating predefined deformation models with constraint points, and generating force models) may be carried out at the 3D scanning system (e.g., the 3D scanning system 100 shown in FIG. 1A) rather than in the 3D digitization system 112. The 3D digitization system 112 may alternatively or additionally include elements other than those shown.

Figure 2:
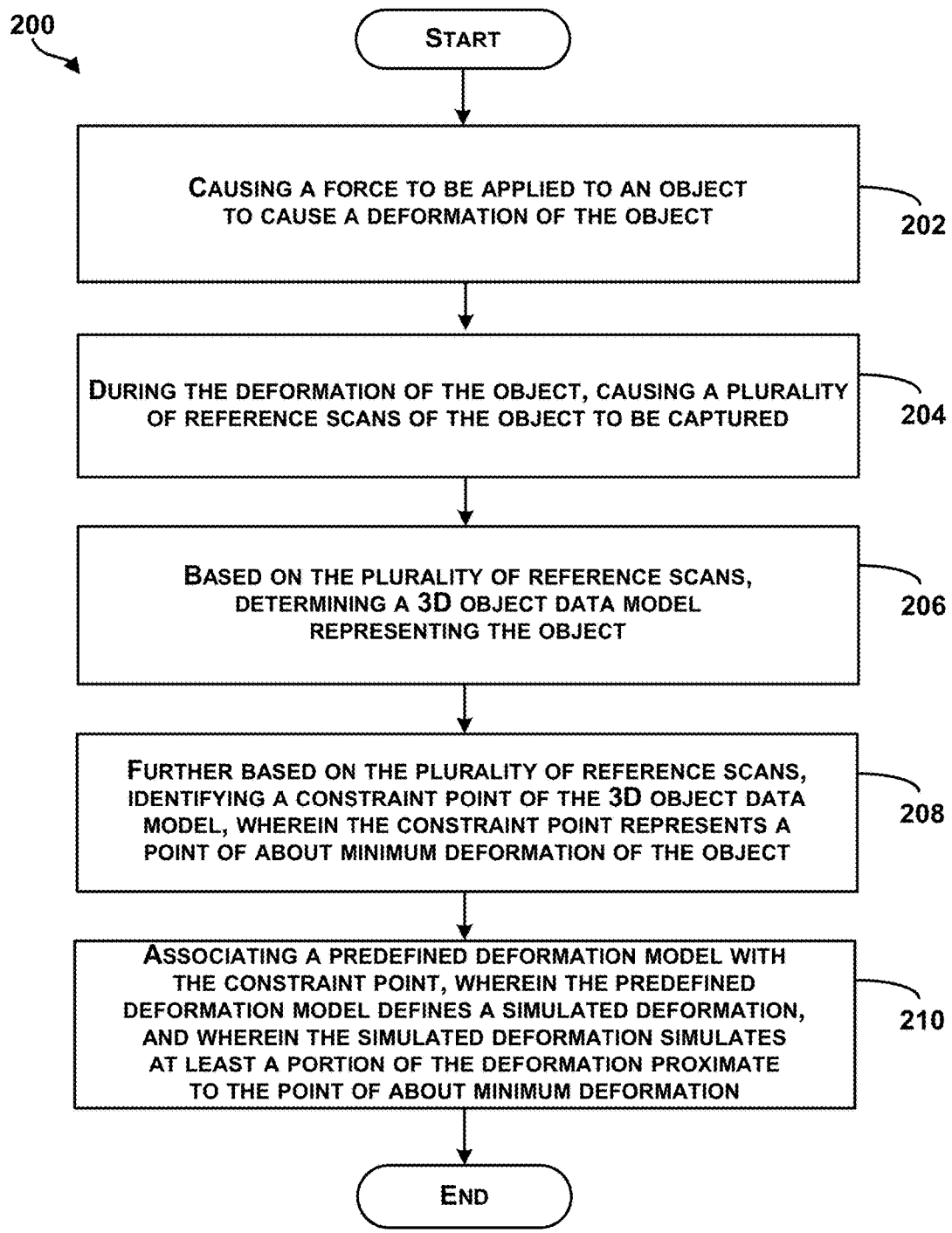
FIG. 2 is a block diagram of an example method for defining a simulated deformation of a 3D object data model, in accordance with embodiments described herein.

FIG. 2 is a block diagram of an example method for defining a simulated deformation of a 3D object data model, in accordance with embodiments described herein. Method 200 shown in FIG. 2 presents an embodiment of a method that, for example, could be used with the systems described herein, such as the 3D scanning system 100 described above in connection with FIG. 1A and/or the 3D digitization system 112 described above in connection with FIG. 1B. The blocks 202-210 of method 200 may be performed by a single system or by multiple systems. For example, one or more of blocks 202-210 may be performed by a 3D scanning system, such as the 3D scanning system 100 described above in connection with FIG. 1A, while others of blocks 202-210 may be performed by a 3D digitization system, such as the 3D digitization system 112 described above in connection with FIG. 1B. As another example, all of the blocks 202-210 may be performed by a 3D scanning and digitization system. Other examples are possible as well.

Method 200 may include one or more operations, functions, or actions as illustrated by one or more of blocks 202-210. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

In addition, for the method 200 and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer-readable medium, such as, for example, a storage device including a disk or hard drive. The computer-readable medium may include a non-transitory computer-readable medium, for example, such as computer-readable media that store data for short periods of time like register memory, processor cache, and Random Access Memory (RAM). The computer-readable medium may also include non-transitory media, such as secondary or persistent long term storage, like read only memory (ROM), optical or magnetic disks, and compact-disc read only memory (CD-ROM), for example. The computer-readable media may also be any other volatile or non-volatile storage systems. The computer-readable medium may be considered a computer-readable storage medium, a tangible storage device, or other article of manufacture, for example.

In addition, for the method 200 and other processes and methods disclosed herein, each block may represent circuitry that is configured to perform the specific logical functions in the process.

The method 200 begins at block 202 where a system causes a force to be applied to an object, thereby causing a deformation of the object. The force may take any of the forms described above. Similarly, the deformation may take any of the forms described above. The system may cause the force using, for example, a force generator or a platform, as described above. Alternatively, the force may be applied by a user of the system. The system may further generate instructions to be provided to a force generator to cause or instruct the force to be applied. The force may be applied in other manners as well.

The method 200 continues at block 204 where, during the deformation of the object, the system causes a plurality of reference scans of the object to be captured. The system may generate instructions to be provided to an image-capture device to cause or instruct the image-capture device to capture the scans. The system may capture the reference scans using a number of 3D scanning and digitization techniques, including, for example, structured light illumination techniques, x-ray, ultrasound, and magnetic resonance stimulus techniques, and video processing techniques. Other 3D scanning and digitization techniques are possible as well.

In some embodiments, the plurality of reference scans may include at least one reference scan captured before the force is applied to the object and at least one reference scan after the force is applied to the object. That is, the plurality of reference scans may include at least one reference scan of the object before it is deformed and at least one reference scan of the object while the object is being deformed and/or after the object has been deformed. In this manner, the plurality of reference scans may capture a continuous (e.g., as opposed to an instant) deformation of the object caused by the applied force.

The method 200 continues at block 206 where, based on the plurality of reference scans, the system determines a 3D object data model representing the object. The system may determine the 3D object data model by, for example, generating the 3D object data model using a number of 3D scanning and digitization techniques, including those described above. The 3D object data model may be generated, for example, by combining scans of the object. Alternatively, the system may determine the 3D object data model by, for example, querying a 3D object data model database and receiving the 3D object data model from the 3D object data model database. The system may determine the 3D object data model in other manners as well.

The method 200 continues at block 208 where, further based on the plurality of reference scans, the system identifies a constraint point of the 3D object data model. The constraint point may represent a point substantially of minimum deformation of the object. The constraint point may be identified in a number of manners. For example, the system may determine an "optical flow" of the object, which may be understood to refer to an apparent movement of the object resulting from the deformation of the object. As the object is deformed, the apparent movement of the point substantially of minimum deformation will be significantly less than the apparent movement elsewhere on the object. Therefore, the optical-flow vectors in the area of the point substantially of minimum deformation will, on average, have a lesser magnitude than optical-flow vectors elsewhere on the object, thus creating an optical-flow differential in the area that includes the point substantially of minimum deformation. The constraint point may then be determined to be a point on the 3D object data model that represents the point substantially of minimum deformation on the object. Other examples are possible as well.

At block 210, the system associates a predefined deformation model with the constraint point. The predefined deformation model may, for example, be predefined by deforming an object while obtaining reference scans of the object, as described above, and determining the predefined deformation model based on the reference scans. Further, the predefined deformation model may define a simulated deformation. The simulated deformation may simulate at least a portion of the deformation proximate to the point substantially of minimum deformation. The predefined deformation model may take a number of forms. For example, the predefined deformation model may take the form of one or more equations defining deformation of the 3D object data model. The predefined deformation model may take the constraint point as an input variable and/or may be centered at the constraint point. Other examples are possible as well.

The predefined deformation model may be selected from a plurality of predefined deformation models stored at or otherwise accessible to the system. For example, the system may select as the predefined deformation model the predefined deformation model that defines a simulated deformation of the object that best approximates the deformation of the object. In some embodiments, the simulated deformation defined by the predefined deformation model may exactly, almost exactly, or closely simulate the deformation of the object. In other embodiments, the simulated deformation defined by the predefined deformation model may be simplified as compared to the deformation of the object, such that the simulated deformation defined by the predefined deformation model may only approximately simulate the deformation of the object. The simulated deformation of such a simplified predefined deformation model may approximate have a reduced file size. Other examples are possible as well.

In some embodiments, the system may further generate a force model for the 3D object data model. The force model may include information indicative of the force applied to the object, the constraint point, and the predefined deformation model associated with the constraint point. The system may store the force model in a database, such as the 3D object data model database 124 described above in connection with FIG. 1B.

While the method 200 described identifying only one constraint point, in some embodiments, more than one constraint point may be identified. In these embodiments, a predefined deformation model may be selected for each of the identified constraint points. The selected predefined deformation models may be the same or different for different constraint points. Further, in these embodiments, the system may generate force models for each of the identified constraint points. Each force model may include the force applied to the object, the identified constraint point, and the predefined deformation model selected for the identified constraint point. Each of the force models may be stored in a database, such as the 3D object data model database 124 described above in connection with FIG. 1B.

Figure 3A:
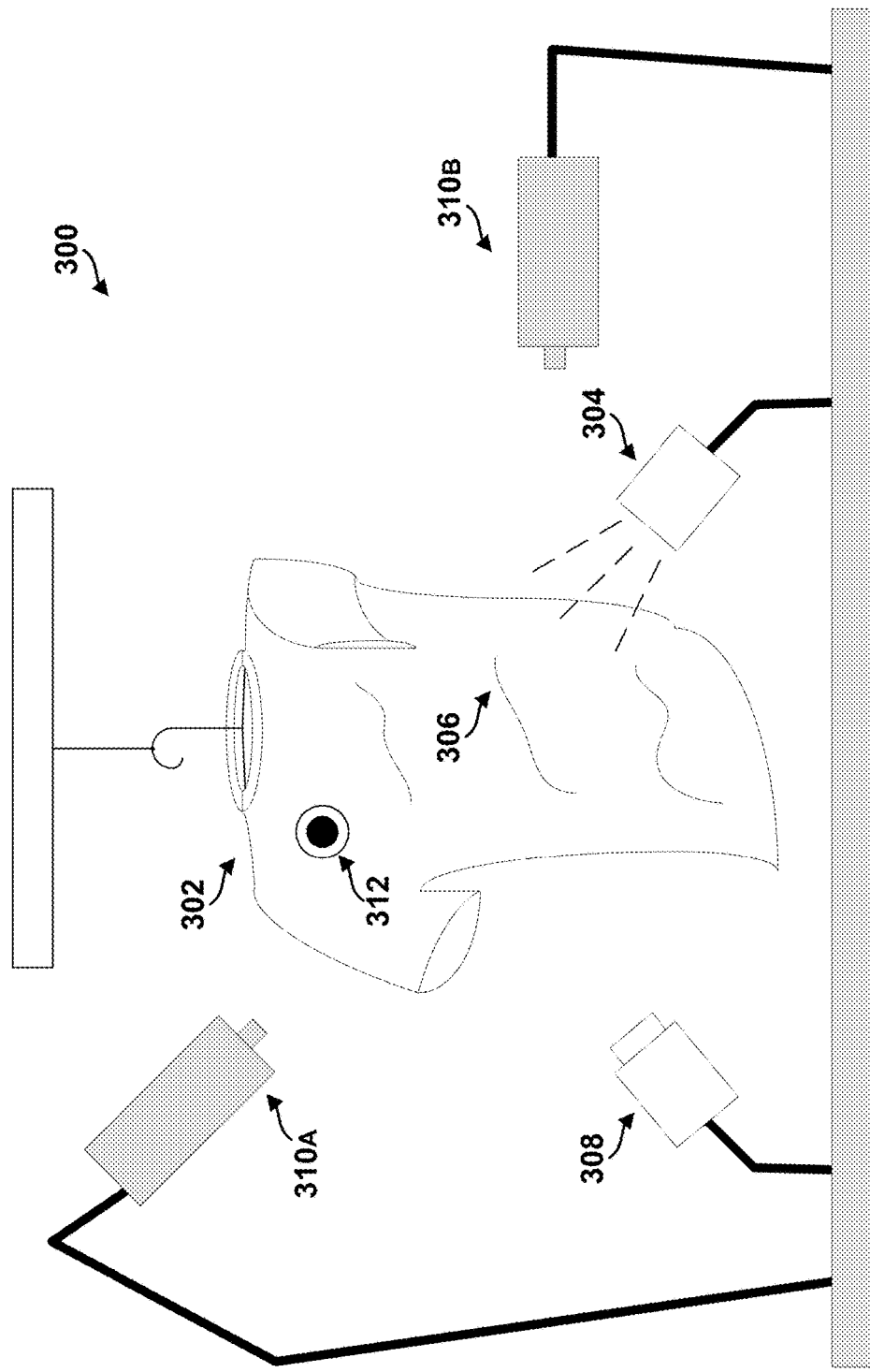
FIGS. 3A-B illustrate an example of defining a simulated deformation of a 3D object data model (3A) and an example of a force model for a 3D object data model with one constraint point (3B), in accordance with embodiments described herein.
Figure 3B:
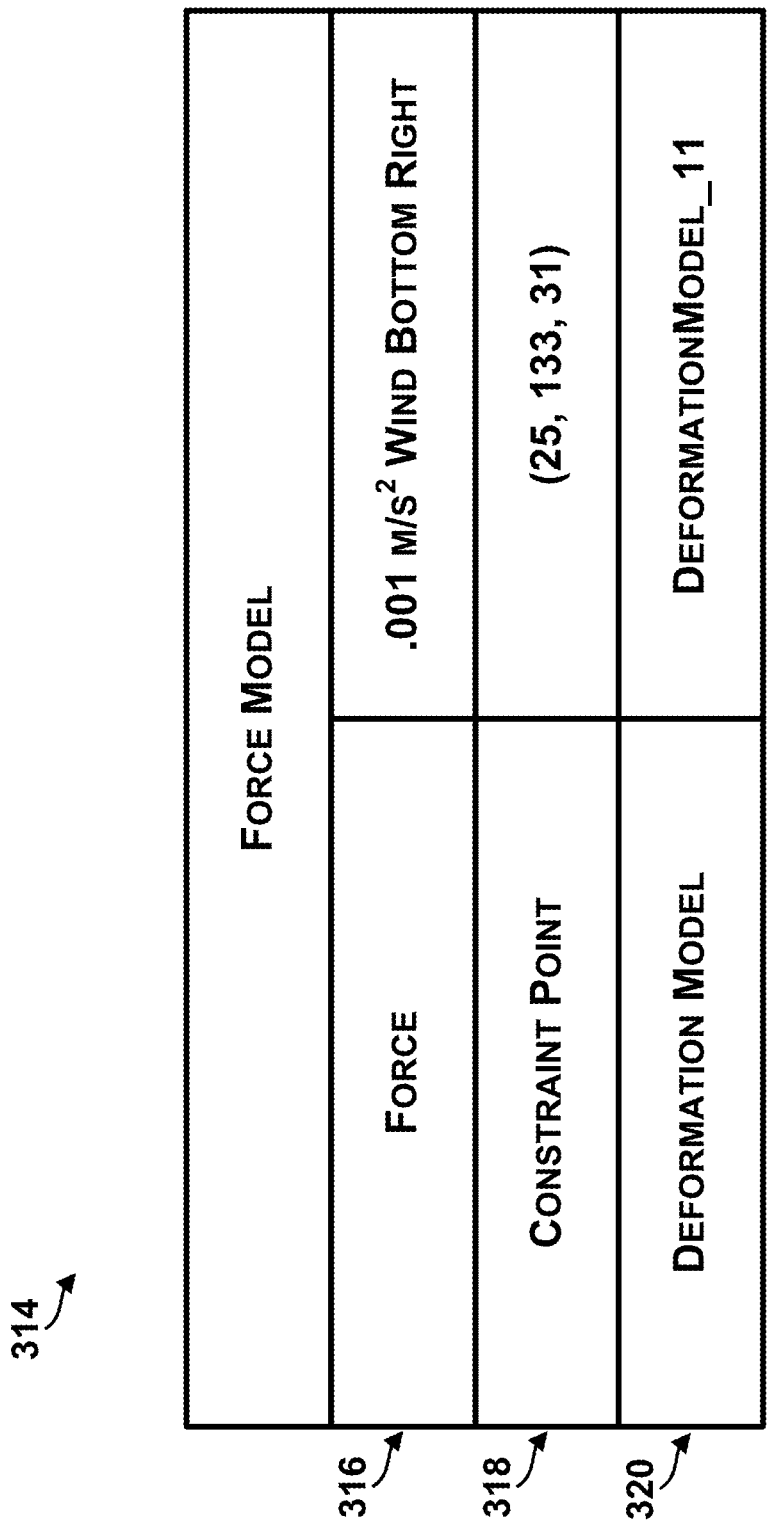

FIGS. 3A-B illustrate an example of defining a simulated deformation of a 3D object data model (3A) and an example of a force model for a 3D object data model with one constraint point (3B), in accordance with embodiments described herein. As shown in FIG. 3A, a 3D scanning and digitization system 300 includes an object 302. While the object 302 is shown as a shirt, other objects are possible as well.

The 3D scanning and digitization system 300 may be used to define a simulated deformation of a 3D object data model representing the object 302. For example, the 3D scanning and digitization system 300 may be used to define a simulated deformation of the 3D object data model simulating the deformation of the object 302 that results from a pressurized air force of the wind on the object 302 while the object 302 is worn by a wearer.

To this end, a force generator 304 may apply a force to the object 302, causing a deformation 306 of the object 302. The force may be, for example, pressurized air. While the force generator 304 is shown to be positioned on the bottom right of the object 302, the force generator 304 may be otherwise positioned relative to the object 302. For example, the force generator 304 may be positioned directly below the object 302. In embodiments where the object 302 is a shirt, such positioning of the force generator 304 directly below the object 302 may allow the force generator 304 to apply pressurized air up into the object 302 (e.g., to blow wind up into the shirt), thereby causing a deformation of the object 302. Other examples are possible as well.

While the object 302 is being deformed, a projector 308 may be used to project a structured light pattern onto the object 302, and cameras 310A, 310B may be used to detect reflections of the structured light pattern off the object 302, as described above. Based on the detected reflections, the system 300 may capture a plurality of reference scans of the object 302.

Based on the reference scans, the system 300 may generate a 3D object data model of the object 302, as described above. Further based on the reference scans, the system 300 may identify a constraint point on the 3D object data model.

The constraint point may represent a point 312 substantially of minimum deformation of the object 302, as described above. The system 300 may then associate a predefined deformation model with the constraint point, as described above.

Once the system 300 has generated the 3D object data model, identified the constraint point, and the associated the predefined deformation model with the constraint point, the system 300 may generate a force model for the 3D object data model, as described above. An example force model 314 is shown in FIG. 3B.

As shown, the force model 314 includes information indicative of the force 316, information indicative of the identified constraint point 318, and information indicative of the predefined deformation model 320. While the information indicative of the force 316 is shown in the unit $m/s^2$ with the qualitative description "wind bottom right," other units (e.g., metric units, U.S. units, etc.) of the force and/or other indications of the force (e.g., alphanumeric, numeric, etc.) are possible as well. Further, while the information indicative of the constraint point 318 is shown in 3D coordinates (e.g., x,y,z) indicating a location of the constraint point on the 3D object data model, other coordinate systems or other indications of a location on the 3D object data model are possible as well. Still further, while the information indicative of the predefined deformation model 320 is shown with a particular indication, other indications, file names, and/or equations are possible as well.

Figure 4A:
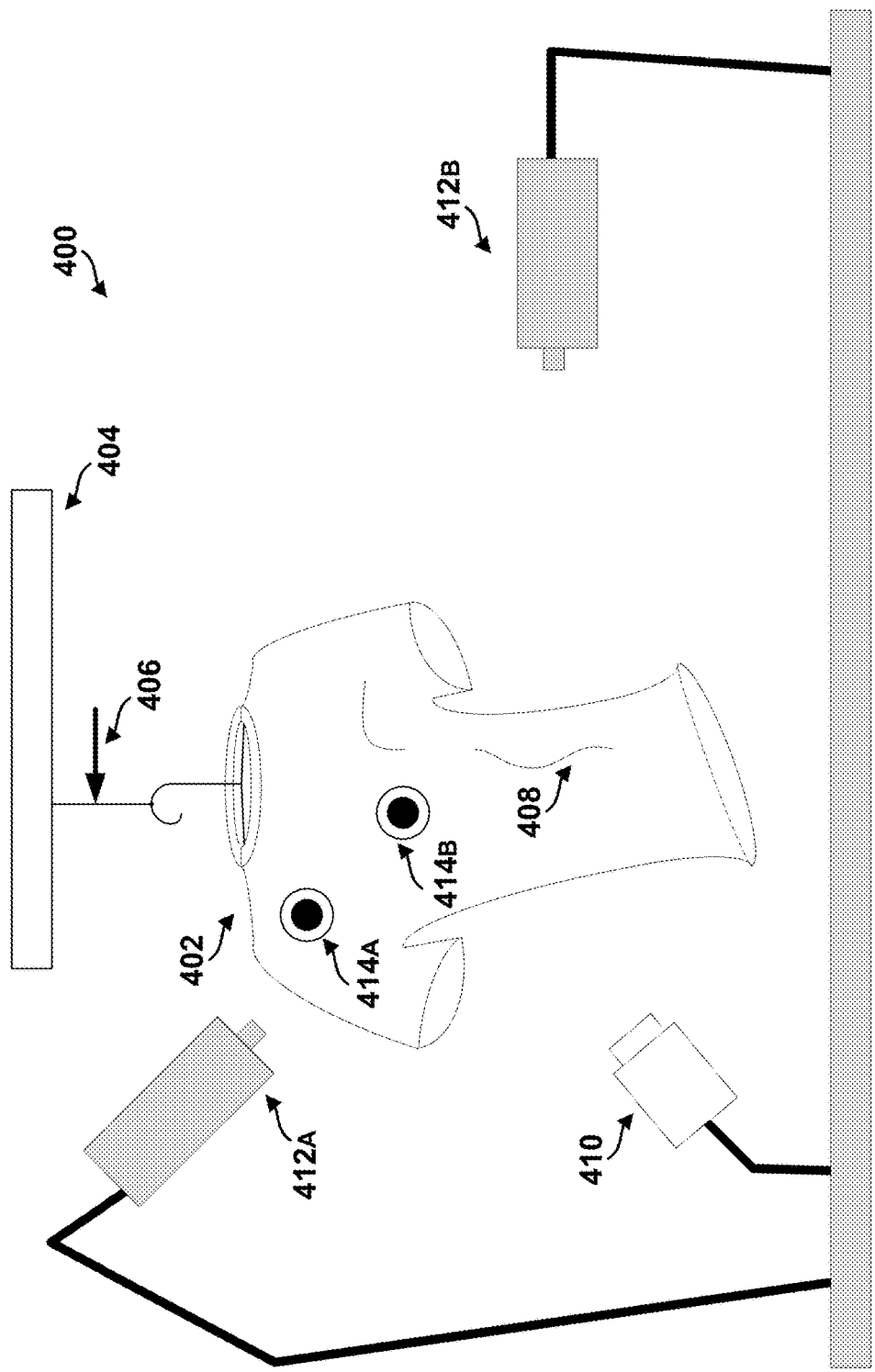
FIGS. 4A-B illustrate an example of defining a simulated deformation of a 3D object data model (4A) and an example of a force model for a 3D object data model with two constraint points (4B), in accordance with embodiments described herein.
Figure 4B:
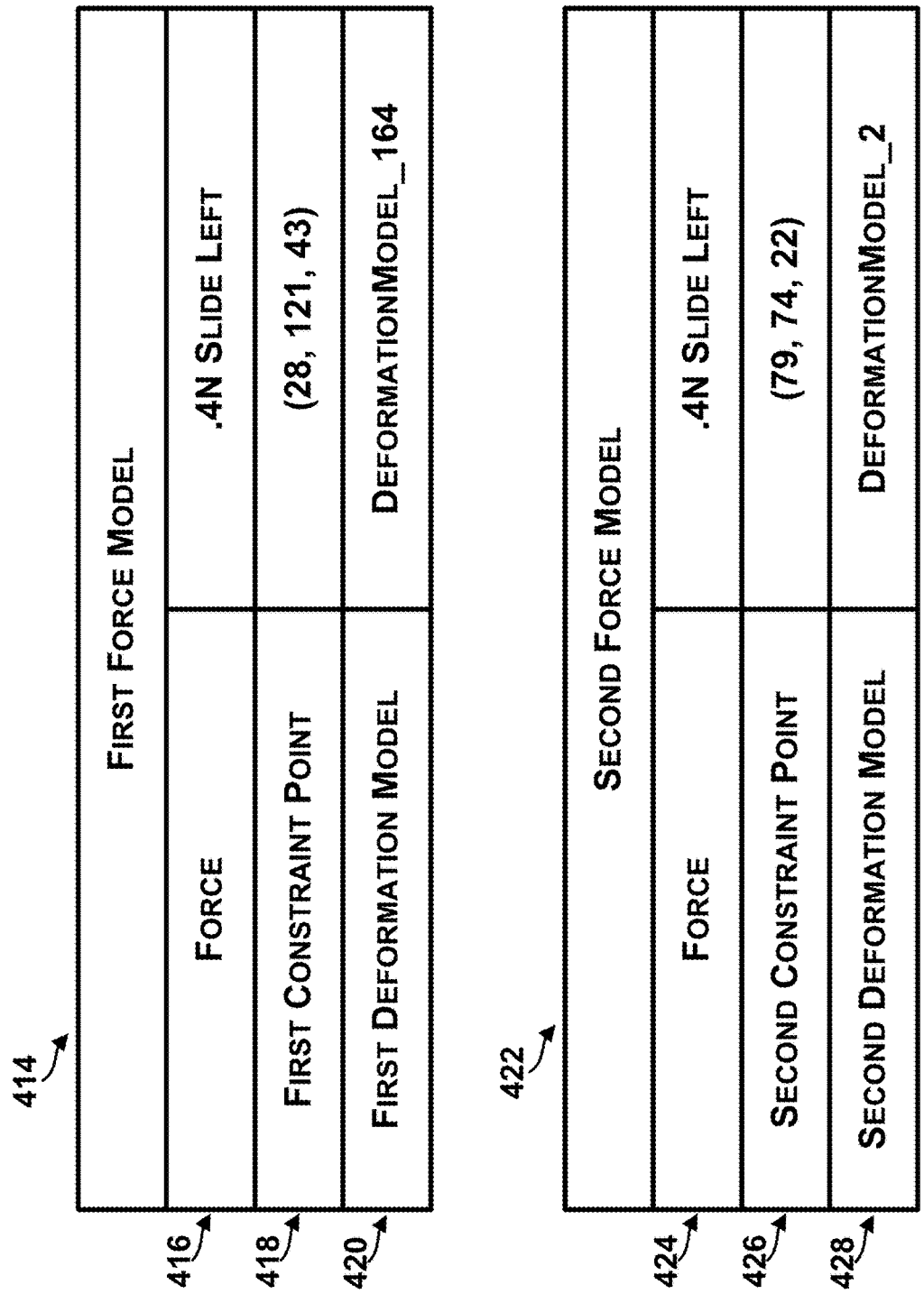

FIGS. 4A-B illustrate an example of deforming an object during scanning (4A) and an example of a force model for a 3D object data model with two constraint points (4B), in accordance with embodiments described herein. As shown in FIG. 4A, a 3D scanning and digitization system 400 includes an object 402. While the object 402 is shown as a shirt, other objects are possible as well.

The 3D scanning and digitization system 400 may be used to define a simulated deformation of a 3D object data model representing the object 402. For example, the 3D scanning and digitization system 400 may be used to define a simulated deformation of the 3D object data model simulating the deformation of the object 402 that results from a physical motion force on the object 302 as a wearer of the object 302 runs.

To this end, a platform 404 applies a physical motion force to the object 402 by sliding the object 402, as indicated by the arrow 406. The force causes a deformation 408 of the object 402. While the object 402 is being deformed, a projector 410 may be used to project a structured light pattern onto the object 402, and cameras 412A, 412B may be used to detect reflections of the structured light pattern off the object 402, as described above. Based on the detected reflections, the system 400 may capture a plurality of reference scans of the object 402.

Based on the reference scans, the system 400 may generate a 3D object data model of the object 402, as described above. Further based on the reference scans, the system 400 may identify two constraint points on the 3D object data model. In particular, the system 400 may identify a first constraint point that represents a first point 414A substantially of minimum deformation of the object 402, as described above. Further, the system 400 may identify a second constraint point that represents a second point 414B substantially of minimum deformation of the object 402, as described above.

The system 400 may then associate a predefined deformation model with each of the constraint points, as described above. That is, the system 400 may associate a first predefined deformation model with the first constraint point and a second predefined deformation model with the second constraint point. The first predefined deformation model may be the same as or different than the second predefined deformation model.

Once the system 400 has generated the 3D object data model, identified the two constraint points and associated a predefined deformation model with each of the two constraint points, the system may generate a first force model for the first constraint point and a second force model for the second constraint point. Example force models 414, 422 are shown in FIG. 3B.

As shown, the first force model 414 includes information indicative of the force 416 applied to the object 402, information indicative of the first constraint point 418, and information indicative of the first predefined deformation model 420. Similarly, the second force model 422 includes information indicative of the force 416 applied to the object 402, information indicative of the second constraint point 424, and information indicative of the second predefined deformation model 426. Each of the information indicative of the force 416, information indicative of the first constraint point 418, information indicative of the first predefined deformation model 420, information indicative of the second constraint point 424, and information indicative of the second predefined deformation model 426 may take any of the forms described above.

In general, a force model may be generated for each constraint point identified on a 3D object data model when a force is applied to the object represented by the 3D object data model. For example, as only one constraint point was identified in the example shown in FIG. 3A, only one force model was generated, as shown in FIG. 3B. As another example, two constraint points were identified in the example shown in FIG. 4A, such that two force models were generated, as shown in FIG. 3B. More constraint points and force models are possible as well.

Figure 5:
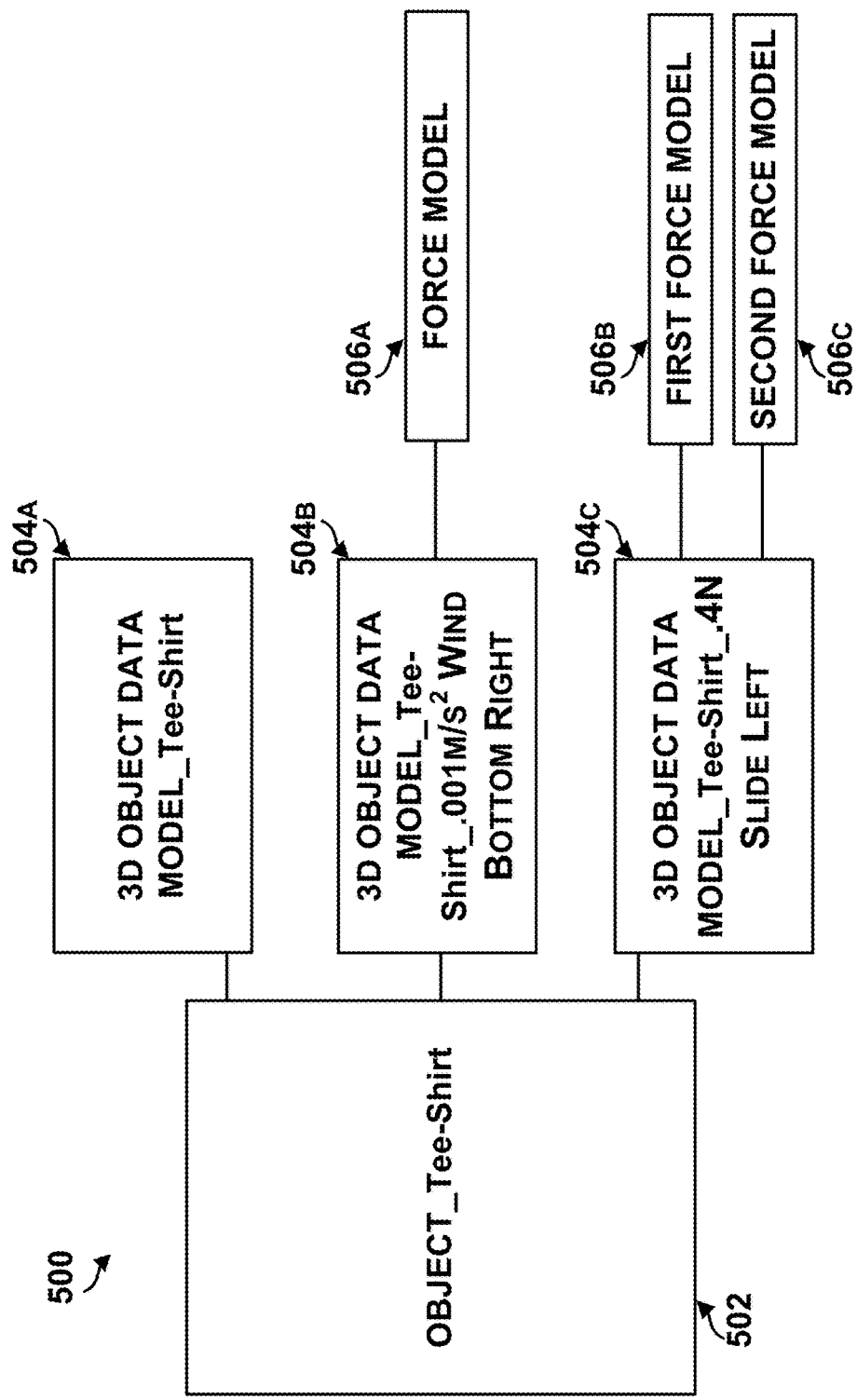
FIG. 5 is a block diagram of an example 3D object data model database, in accordance with embodiments described herein.

Force models, such as the force model 314, the first force model 414, and the second force model 422, may be stored in a database, such as the 3D object data model database described above. FIG. 5 shows a block diagram of an example 3D object data model database 500, in accordance with some embodiments.

The 3D object database 500 may include 3D object data models representing a number of objects. One or more 3D object data models may represent the same object. For example, as shown, a first 3D object data model 504A, a second 3D object data model 504B, and a third 3D object data model 504C each represent the object 502. For purposes of illustration, the object 502 may be a tee-shirt similar to the object 302 described above in connection with FIGS. 3A-B and the object 402 described above in connection with FIGS. 4A-B.

Each of the first 3D object data model 504A, the second 3D object data model 504B, and the third 3D object data model 504C may have been generated by a 3D scanning and digitization system, such as the 3D scanning system 100 described above in connection with FIG. 1A and/or the 3D digitization system 112 described above in connection with FIG. 1B. For example, the first object data model 504A may have been generated by scanning the object 502 and generating the object data model 504A representing the object 502. No force may have been applied during the scanning. Similarly, the second object data model 504B may have been generated by applying a first force to the object 502, scanning the object 502, and generating the object data model 504B representing the object 502. The first force may have been, for example, a 0.001 m/s² wind force applied from the bottom right of the object 502. Similarly, the third object data model 504C may have generated by applying a second force to the object 502, scanning the object 502, and generating the third object data model 504C representing the object 502. The second force may have been, for example, a 0.4N slide to the left of the object 502.

As shown, no force models are be associated with the first 3D object data model 504A. This is because no force was applied to the object 502 to generate the first 3D object data model 504A.

On the other hand, a force model 506A is associated with the second 3D object data model 504B. The force model 506A may, for example, be similar to the force model 314 shown in FIG. 3B. In particular, the first force model 506A may include information indicative of the force applied by the force generator (a 0.001 m/s² wind force applied from the bottom right of the object), information indicative of the constraint point (25, 133, 31), and information indicative of the predefined deformation model associated with the constraint point (DeformationModel_11).

Similarly, two force models 506B, 506C are associated with the third 3D object data model 504B. The force models 506B, 506C may, for example, be similar to the first and second force models 414, 422, respectively, shown in FIG. 4B. In particular, the force model 506B may include information indicative of the force applied by the platform (a 0.4N slide force to the left), information indicative of the first constraint point (28, 121,43), and information indicative of the first predefined deformation model associated with the first constraint point (DeformationModel_164). Similarly, the force model 506C may include information indicative of the force applied by the platform (a 0.4N slide force to the left), information indicative of the second constraint point (79, 74, 22), and information indicative of the second predefined deformation model associated with the second constraint point (DeformationModel_2).

While there are shown to be three 3D object data models 504A, 504B, 504C representing the object 502, in some embodiments there may be more or fewer three 3D object data models representing object 502, or any of the objects represented in the 3D object data model database. Further, while the 3D object data models 504A, 504B, and 504C are shown to be associated with zero, one, and two force models, respectively, in some embodiments the 3D object data models 504A, 504B, and 504C may be associated with more or fewer force models. Other configurations of the 3D object data model database 500 are possible as well.

Figure 6:
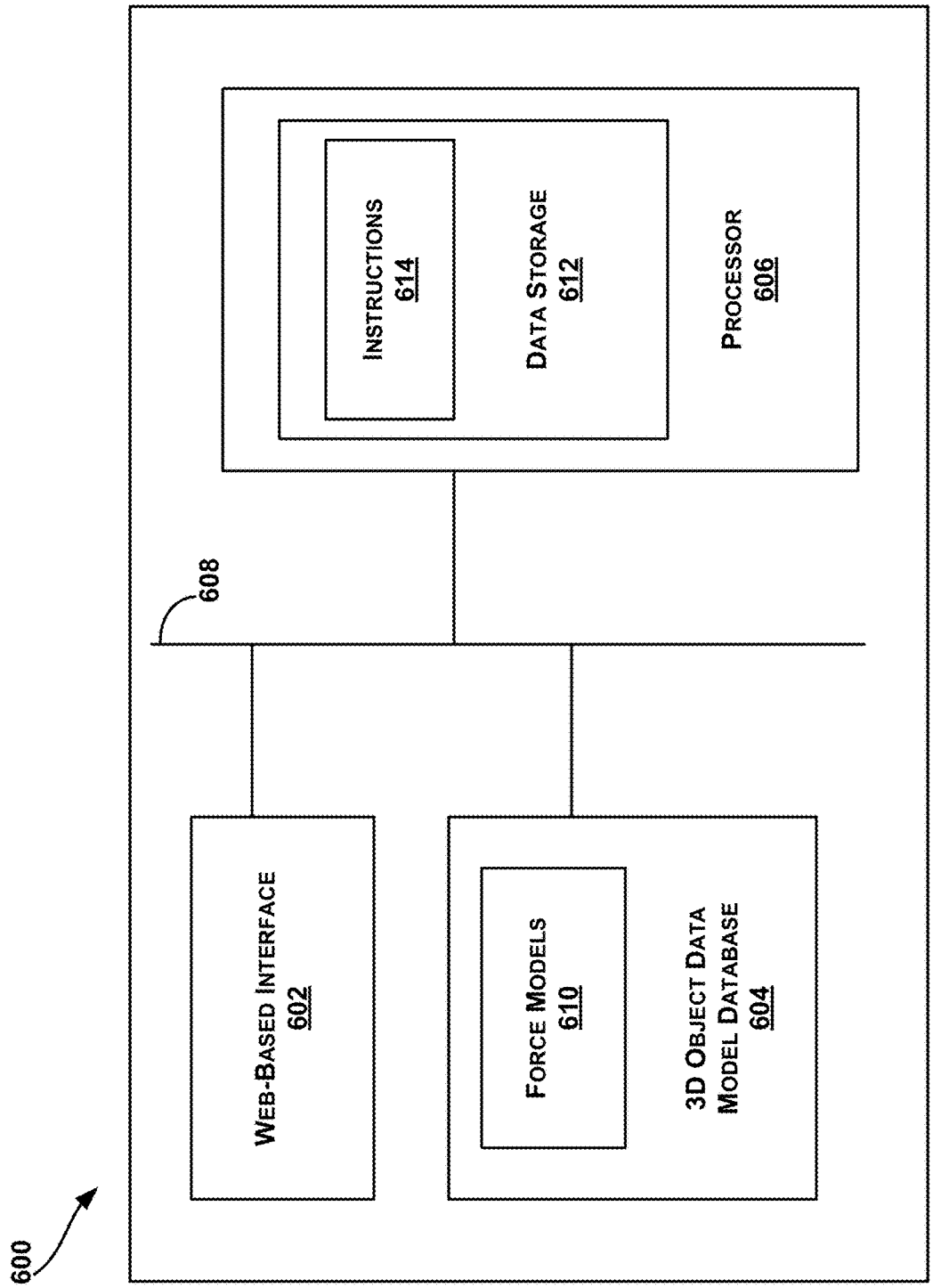
FIG. 6 is a block diagram of an example server for generating a simulated deformation of a 3D object data model, in accordance with embodiments described herein.

FIG. 6 is a block diagram of an example server for generating a simulated deformation of a 3D object data model, in accordance with embodiments described herein. The server 600 shown in FIG. 6 may be a computer-based system and may be integrated with or communicatively coupled to one or both of a 3D scanning system, such as the 3D scanning system 100 described above in connection with FIG. 1A, and a 3D digitization system, such as the 3D digitization system 112 described above in connection with FIG. 1B. Further, the server 600 may be co-located with or remote from one or both of a 3D scanning system, such as the 3D scanning system 100 described above in connection with FIG. 1A, and a 3D digitization system, such as the 3D digitization system 112 described above in connection with FIG. 1B.

As shown in FIG. 6, the server 600 for generating a simulated deformation of a 3D object data model may include a web-based interface 602, a 3D object data model database 604, and a processor 606, all of which may be communicatively linked together by a system bus, network, and/or other connection mechanism 608.

The web-based interface 602 may be configured to receive a request to generate a simulated deformation of a 3D object data model. Further, in some embodiments, the web-based interface 602 may be configured to receive a request to generate a display of the 3D object data model. To this end, the web-based interface 602 may be configured to provide a web-based application. The web-based application may be accessible by any number of computing devices including, for example, a personal computer, a laptop computer, a tablet computer, and/or a smartphone. Other computing devices are possible as well. In some embodiments, a user of such a computing device may access the web-based application by entering a website address into a web browser and/or running a software application on the computing device. Further, the user of such a computing device may transmit to the server 600 the request to generate the simulated deformation of a 3D object data model and the request by interacting with and/or selecting one or more features in the web-based application. In some embodiments, the user of such a computing device may additionally transmit to the server 600 the request to generate the display of the 3D object data model. Still further, the user of such a computing device may receive the simulated deformation of the 3D object data model through the web-based application, such that the simulated deformation of the 3D object data model may be displayed in the web browser or in the software application on the computing device. In some embodiments, the user of such a computing device may additionally receive the display of the 3D object data model through the web-based application, such that the display of the 3D object data model may be displayed in the web browser or in the software application on the computing device. The web-based application may be accessible in other manners as well.

The web-based interface 602 may be arranged to communicate according to one or more other types of wireless communication (e.g. protocols) such as Bluetooth, communication protocols described in IEEE 802.11 (including any IEEE 802.11 revisions), cellular technology (such as GSM, CDMA, UMTS, EV-DO, WiMAX, or LTE), or Zigbee, among other possibilities.

The 3D object data model database 604 may take any of the forms described for the 3D object model database 500 described above in connection with FIG. 5. In embodiments where the server 600 is integrated with a 3D digitization system, such as the 3D digitization system 112 shown in FIG. 1B, the 3D object data model database 604 may be integrated with the 3D object model database 124 shown in FIG. 1B. Alternatively, in embodiments where the server 600 is communicatively coupled to a 3D digitization system, such as the 3D digitization system 112 shown in FIG. 1B, the server 600 may not include the 3D object data model database 604 and may instead access the 3D object data model database 124 at the 3D digitization system 112. Still alternatively, in embodiments where the server 600 is communicatively coupled to a 3D digitization system, such as the 3D digitization system 112 shown in FIG. 1B, the 3D object model database 604 may be a copy of the 3D object data model database 124 or may include different 3D object data models than the 3D object data model database 124. The 3D object data model database 604 may take other forms as well.

The processor 606 may comprise one or more general-purpose processors and/or one or more special-purpose processors. To the extent the processor 606 includes more than one processor, such processors could work separately or in combination.

Data storage 612, in turn, may comprise one or more volatile and/or one or more non-volatile storage components, such as optical, magnetic, and/or organic storage, and data storage 612 may be integrated in whole or in part with the processor 606. As shown, data storage 612 may contain instructions 614 (e.g., program logic) executable by the processor 606 to execute various server functions. In particular, the instructions 614 may be executable by the processor 606 to generate a simulated deformation of a 3D object data model.

To this end, the instructions 614 may be executable by the processor 606 to receive, via the web-based interface 602, a request to generate a simulated deformation of a given 3D object data model in the database of 3D object data models using a given force. The instructions 614 may be further executable by the processor 606 to, in response to receiving the request to generate the simulated deformation of the given 3D object data model using the given force, select from force models 610 at least one force model that includes information indicative of the given force. The instructions 614 may be still further executable by the processor 606 to generate, via the web-based interface 602, the simulated deformation of the 3D object data model using the selected force model.

In some embodiments, the instructions 614 may be further executable to generate a display of the given 3D object data model. In these embodiments, the display may be generated via the web-based interface. For example, the display may be generated in a web browser, software application, or other web-based application using WebGL or OpenGL. Other examples are possible as well. Further, in these embodiments, the display may be generated in response to receiving a request to display the given 3D object data model, such as the request described above. The request may be received via the web-based interface 602 and may, for example, be a search query, such as a text- and/or image-based search. The server 600 may receive the request in other manners as well.

The server 600 may include other elements instead of or in addition to those shown.

Figure 7:
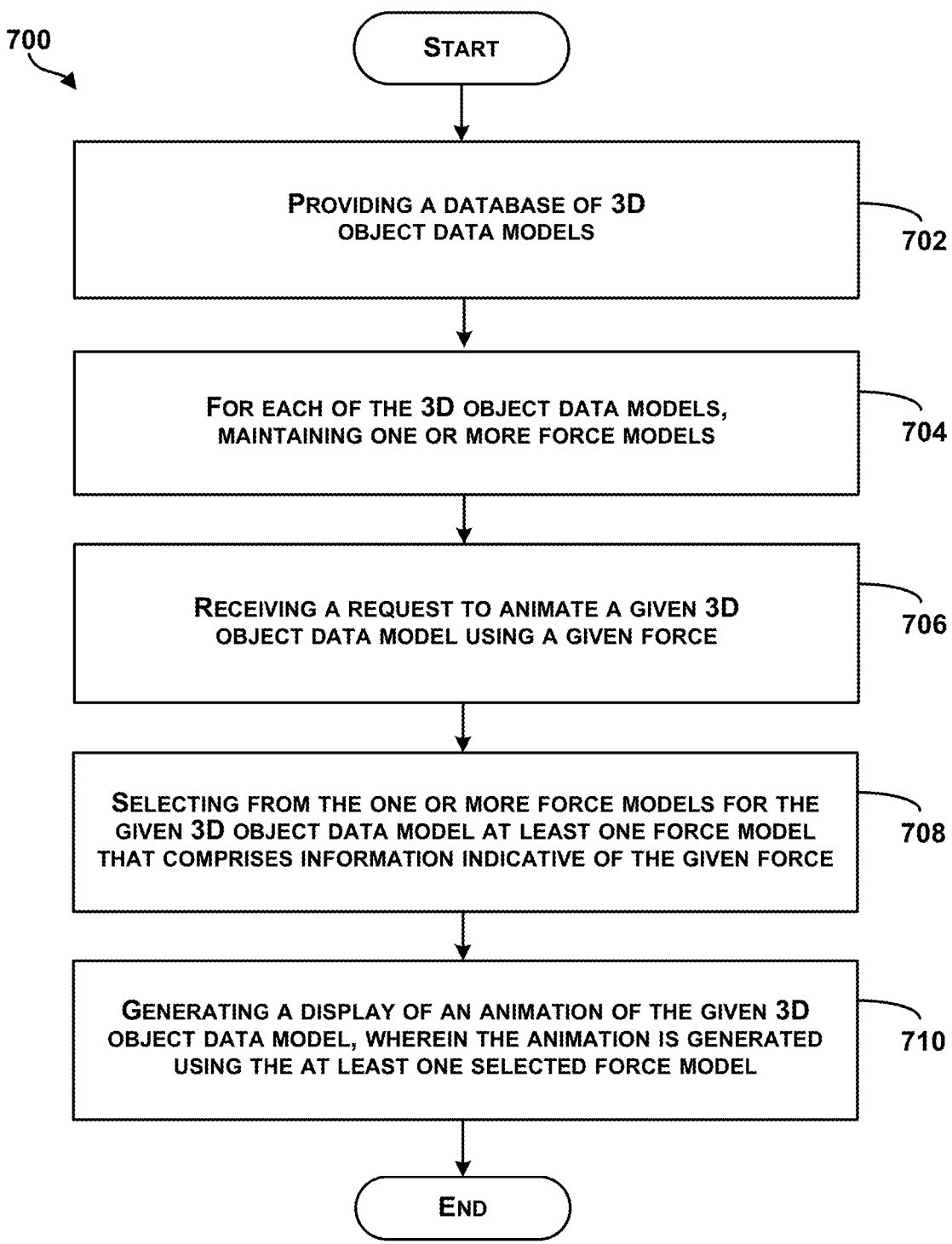
FIG. 7 is a block diagram of an example method for generating a simulated deformation of a 3D object data model, in accordance with embodiments described herein.

FIG. 7 is a block diagram of an example method for generating a simulated deformation of a 3D object data model, in accordance with embodiments described herein. The method 700 may take any of the forms described for the method 200 described above in connection with FIG. 2.

As shown, the method 700 begins at block 702 where a server provides a database of 3D object data models. The database may be similar to, for example, the 3D object data model database 500 described above in connection with FIG. 5.

At block 704, the server maintains, for each of the 3D object data models in the database, one or more force models. The force models may be similar to, for example, the force model 314 described above in connection with FIG. 3B and/or the force models 414, 422 described above in connection with FIG. 4B. To this end, each of the force models may include information indicative of a force, a constraint point on the 3D object data model, and a predefined deformation model for the constraint point. The predefined deformation model may define simulated deformation of the 3D object data model proximate to the constraint point.

The method 700 continues at block 706 where the server receives a request to generate a simulated deformation of a given 3D object data model using a give force. The request may be received through, for example, a web-based interface and/or a web-based application, such as the web-based interface 602 described above in connection with FIG. 6. The request may be received in other manners as well.

At block 708, the server selects from the one or more force models for the given 3D object data model at least one force model that comprises information indicative of the given force. For example, if only one force model for the given 3D object data model include the given force (meaning only one constraint point was identified on the 3D object data model when the force models for the given force were generated, as described above), the server may select only one force model. As another example, if two force models for the given 3D object data model include the given force (meaning two constraint points were identified on the 3D object data model when the force models for the given force were generated, as described above), the server may select two force models. The server may select more than two force models as well.

At block 710, the server generates the simulated deformation of the given 3D object data model. The server may generate the simulated deformation of the given 3D object data model using the at least one selected force model. The server may generate the simulated deformation of the given 3D object data model in a number of manners.

In embodiments where the at least one selected force model comprises only one selected force model, generating the simulated deformation may involve simulating a deformation of the given 3D object data model based on the predefined deformation model in the selected force model. That is, the simulated deformation may be defined by the predefined deformation model. To this end, the simulated deformation may, for example, take the constraint point as an input variable and/or be centered at the constraint point indicated in the selected force model.

In embodiments where the at least one selected force model comprises two force models, such as a first selected force model and a second selected force model, generating the simulated deformation may involve simulating a deformation of the given 3D object data model based on a first predefined deformation model in the first selected force model and a second predefined deformation model in the second selected force model. That is, the simulated deformation may be defined by the first predefined deformation model and the second predefined deformation model. To this end, a portion of the simulated deformation may, for example, take the first constraint point as an input variable and/or be centered at a first constraint point indicated in the first selected force model. Further, another portion of the simulated deformation may, for example, take the first constraint point as an input variable and/or be centered at a second constraint point indicated in the second selected force model.

The simulated deformation may be similarly generated when the at least one selected force model comprises more than two force models.

The server may generate the display of the animation in other manners as well.

Figure 8A:
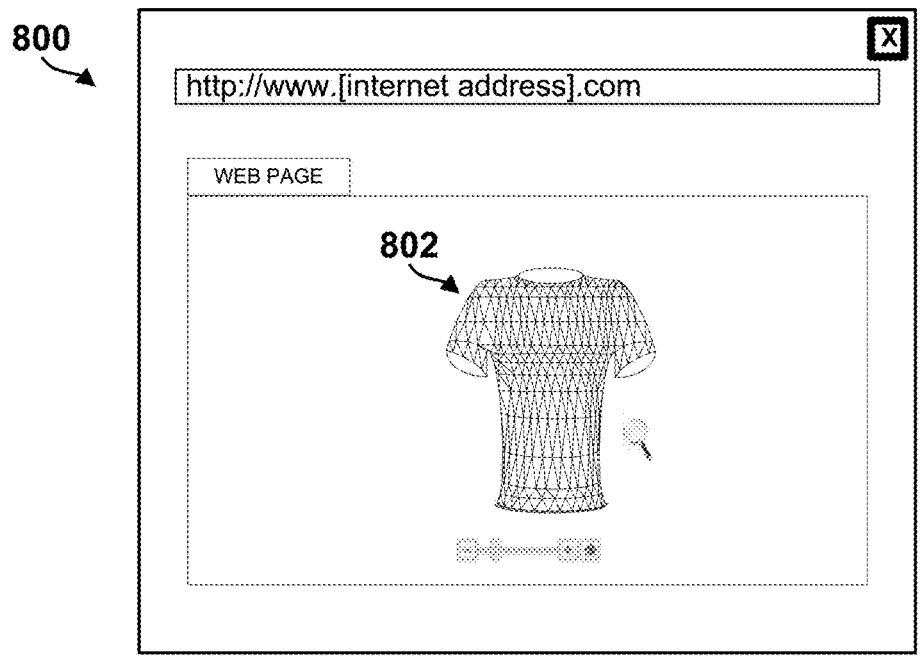
FIGS. 8A-C illustrate an example web-application for generating a display (8A) and a simulated deformation (8B, 8C) of a 3D object data model, in accordance with embodiments described herein.
Figure 8B:
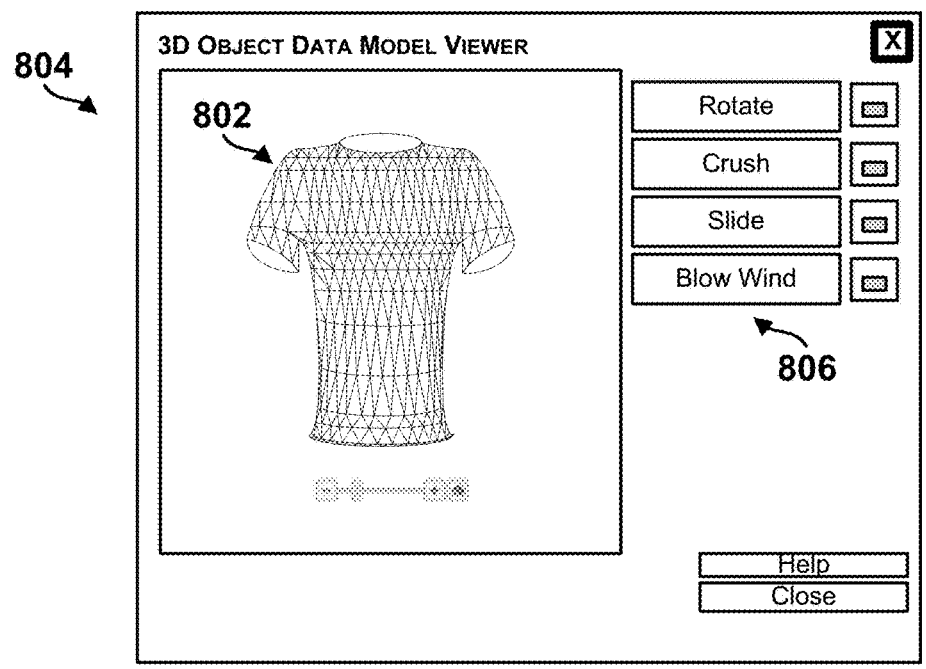
Figure 8C:
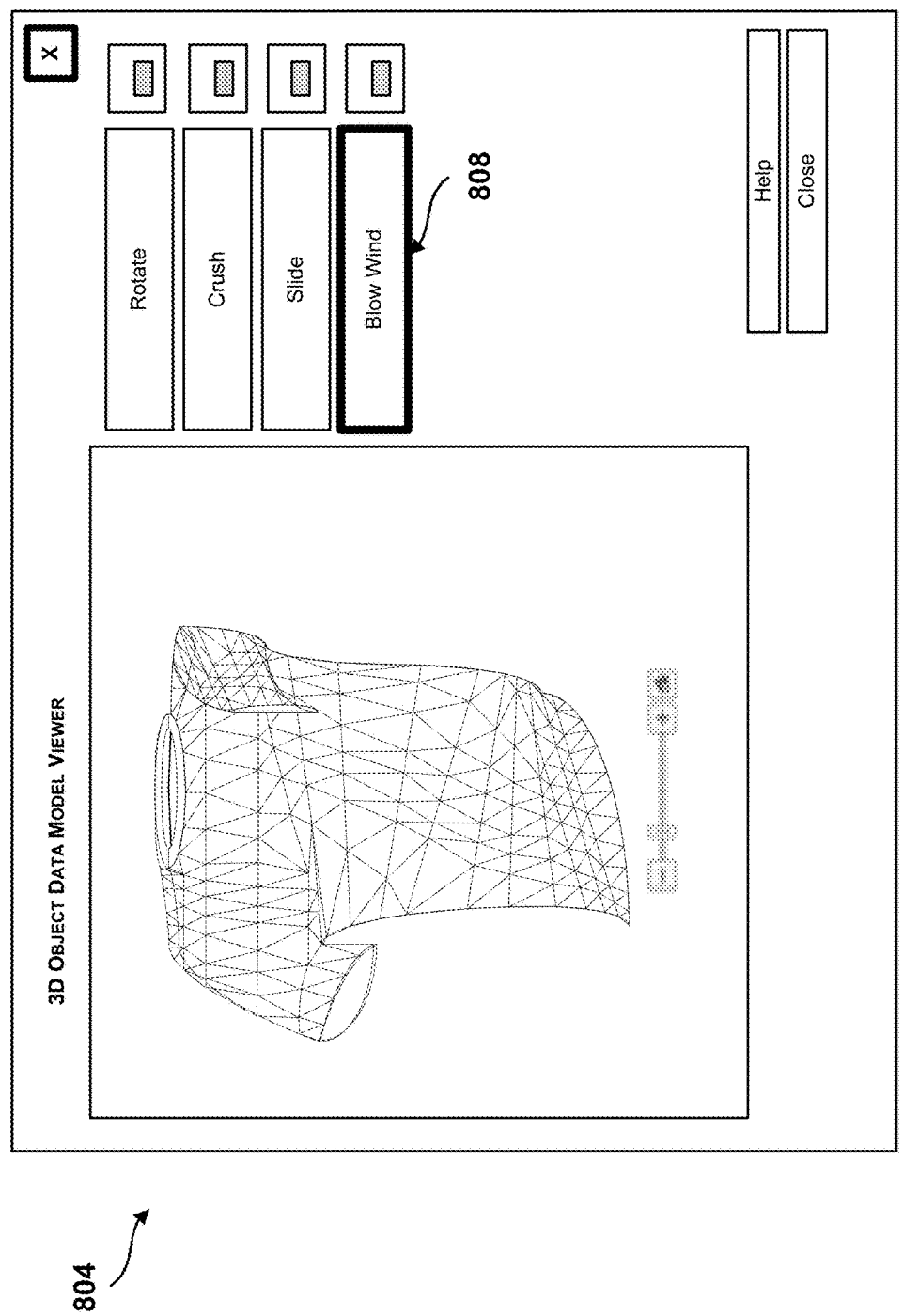

FIGS. 8A-C illustrate an example web-application for generating a display (8A) and a simulated deformation (8B, 8C) of a 3D object data model, in accordance with embodiments described herein. As shown in FIG. 8A, a user has entered a website address into a browser in order to access a web-based application 800 provided by a server, such as the server 600 described above in connection with FIG. 6. In other embodiments, the user may instead run a software application on a computing device in order to access the web-based application 800. The web-based application 800 may be accessible in other manners as well.

Once the user has accessed the web-based application, the user may input a request to generate a display of a 3D object data model 802. To this end, the user may, for example, input a search query, such as a text- and/or image-based query. Other search queries are possible as well.

In response to receiving the request to display the 3D object data model 802, the server may generate a display of the 3D object data model 802. To this end, the server may select the 3D object data model 802 from a 3D object data model database stored at or otherwise accessible to the server, such as the 3D object data model database 500 described above in connection with FIG. 5, and may provide the display of the 3D object data model via the web-based application 800. In some embodiments, the user may manipulate and/or otherwise interact with the 3D object data model 802 via the web-based application 800. For example, the user may rotate the 3D object data model 802 and/or zoom in on the 3D object data model 802. Other examples are possible as well.

FIGS. 8B-C illustrate an example web-based application 804 for generating a simulated deformation of the 3D object data model 802. As shown in FIG. 8B, the web-based application 800 may include indications of a number of forces 806 that may be applied to the 3D object data model 802. The forces 806 may correspond to forces indicated in force models associated with the 3D object data model 802.

As shown in FIG. 8C, the user may select one of the displayed forces. The server may receive via the web-based application 800 the selection of the selected force 808. In some embodiments, the server may interpret the selection of the selected force 808 as a request to generate a simulated deformation of the 3D object data model 802 using the selected force 808.

Accordingly, in response to receiving the selection of the selected force 808, the server may generate the simulated deformation of the 3D object data model. To this end, the server may select at least one force model that includes an indication of the selected force 808 and may generate the simulated deformation based on the predefined deformation models and constraint points indicated in the force models, as described above.

Figure 9:
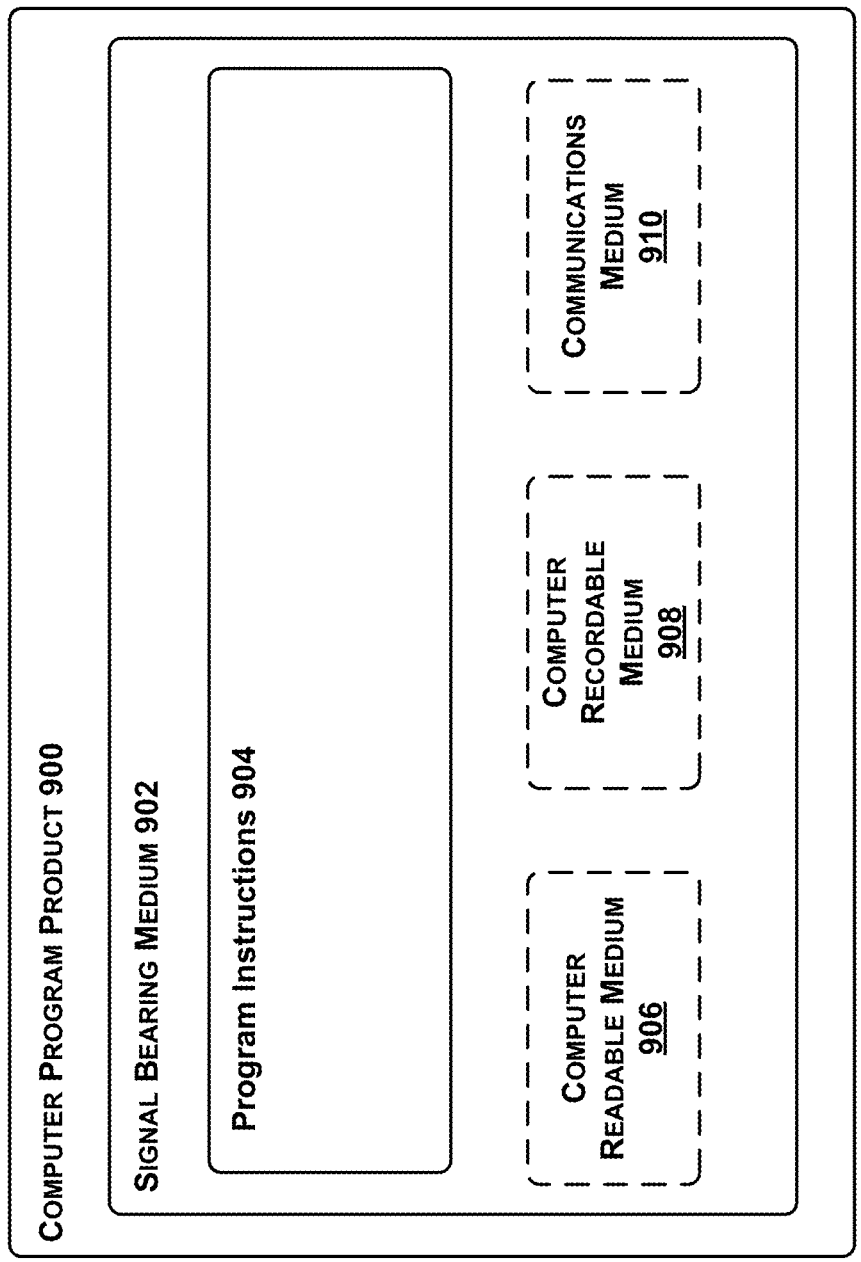
FIG. 9 is a schematic illustrating a conceptual partial view of an example computer program product that includes a computer program for executing a computer process on a computing device, in accordance with embodiments described herein.

In some embodiments, the disclosed methods may be implemented as computer program instructions encoded on a non-transitory computer-readable storage media in a machine-readable format, or on other non-transitory media or articles of manufacture. FIG. 9 is a schematic illustrating a conceptual partial view of an example computer program product 900 that includes a computer program for executing a computer process on a computing device, in accordance with embodiments described herein.

In one embodiment, the example computer program product 900 is provided using a signal bearing medium 902. The signal bearing medium 902 may include one or more programming instructions 904 that, when executed by one or more processors may provide functionality or portions of the functionality described above in connection with FIGS. 1A-8C. In some examples, the signal bearing medium 902 may encompass a computer-readable medium 906, such as, but not limited to, a hard disk drive, a Compact Disc (CD), a Digital Video Disk (DVD), a digital tape, memory, etc. Alternatively or additionally, in some implementations, the signal bearing medium 902 may encompass a computer recordable medium 908, such as, but not limited to, memory, read/write (R/W) CDs, R/W DVDs, etc. Still alternatively or additionally, in some implementations, the signal bearing medium 902 may encompass a communications medium 910, such as, but not limited to, a digital and/or an analog communication medium (e.g., a fiber optic cable, a waveguide, a wired communications link, a wireless communication link, etc.). Thus, for example, the signal bearing medium 902 may be conveyed by a wireless form of the communications medium 910 (e.g., a wireless communications medium conforming with the IEEE 802.11 standard or other transmission protocol).

The one or more programming instructions 904 may be, for example, computer executable and/or logic implemented instructions. In some examples, a computing device including the computer program product 900 may be configured to provide various operations, functions, or actions in response to the programming instructions 904 conveyed to the computing device by one or more of the computer readable medium 906, the computer recordable medium 908, and/or the communications medium 910.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims, along with the full scope of equivalents to which such claims are entitled. It is also to be understood that the terminology used herein is for the purpose of describing particular embodiments only, and is not intended to be limiting.

What is claimed is:

1. A method for providing visualization of deformation of an object, the method comprising:
    causing, by one or more computing devices, a force to be applied to an object to cause a deformation of the object;
    during the deformation of the object, causing, by the one or more computing devices, a plurality of reference scans of the object to be captured;
    determining, by the one or more computing devices, a three-dimensional (3D) object data model representing the object, wherein the 3D object data model is determined based at least in part on the plurality of reference scans;
    identifying, by the one or more computing devices, a constraint point of the 3D object data model, wherein the constraint point represents a point within a predetermined range of a point of minimum deformation of the object;
    determining, by the one or more computing devices, a predefined deformation model that defines a simulated deformation simulating at least a portion of the deformation of the object based on the constraint point;
    receiving a request to generate a respective simulated deformation of the object based on a particular force;
    selecting, from a plurality of force models, at least one force model for the object based on the particular force, wherein a respective force model includes information indicative of a force, a constraint point on the 3D object data model, and reference to a deformation model for the constraint point of the object; and
    generating, by the one or more computing devices, the respective simulated deformation of the object based on the selected force model, wherein the respective simulated deformation includes a representation of a visualization of deformation of the object.

2. The method of claim 1, wherein the force comprises at least one of a linear force or a centrifugal force.

3. The method of claim 1, wherein the deformation of the object comprises one or more of a translation of the object, a rotation of the object, an angulation of the object, and a warp of the object.

4. The method of claim 1, further comprising:
    generating, by the one or more computing devices, the plurality of force models for the 3D object data model, wherein the plurality of force models comprise information indicative of the force, the constraint point, and the predefined deformation model selected for the constraint point; and
    storing, by the one or more computing devices, the generated force models in a database.

5. The method of claim 1, wherein the request to generate the simulated deformation indicates the particular force and the 3D object data model.

6. The method of claim 1, wherein generating the respective simulated deformation comprises simulating deformation of the 3D object data model proximate to the constraint point based on the predefined deformation model in a generated force model.

7. The method of claim 1, further comprising generating, by the one or more computing devices, a display of the respective simulated deformation.

8. The method of claim 7, wherein generating the display of the respective simulated deformation comprises generating the display of the respective simulated deformation in response to receiving a respective request to display the respective simulated deformation.

9. The method of claim 8, wherein the respective request to display the respective simulated deformation comprises at least one of text-based search query or an image-based search query.

10. A computer-based system comprising:
    at least one processor; and
    data storage comprising instructions, that when executed by the at least one processor, cause the computer-based system to:
        cause a force to be applied to an object to cause a deformation of the object;
        during the deformation of the object, cause a plurality of reference scans of the object to be captured;
        determine a three-dimensional (3D) object data model representing the object, wherein the 3D object data model is determined based at least in part on the plurality of reference scans;
        identify a constraint point of the 3D object data model, wherein the constraint point represents a point within a predetermined range of a point of minimum deformation of the object;
        determine a predefined deformation model that defines a simulated deformation simulating at least a portion of the deformation of the object based on the constraint point;
        receive a request to generate a respective simulated deformation of the object based on a particular force; and
        selecting, from a plurality of force models, at least one force model for the object based on the particular force, wherein a respective force model includes information indicative of a force, a constraint point on the 3D object data model, and reference to a deformation model for the constraint point of the object; and
        generating, by the one or more computing devices, the respective simulated deformation of the object based on the selected force model, wherein the respective simulated deformation includes a representation of a visualization of deformation of the object.

11. The computer-based system of claim 10, wherein the instructions are further executable by the at least one processor to cause the computer-based system to:
generate, the plurality of force models for the 3D object data model, wherein the plurality of force models comprise information indicative of the force, the constraint point, and the predefined deformation model selected for the constraint point; and
store the generated force models in the data storage.

12. The computer-based system of claim 10, further comprising a web-based interface, wherein the instructions are further executable by the at least one processor to cause the computer-based system to:
receive, via the web-based interface, a request to generate the respective simulated deformation; and
generate, via the web-based interface, the respective simulated deformation using a generated force model.

13. The computer-based system of claim 12, wherein the web-based interface is configured to provide a web-based application.

14. The computer-based system of claim 13, wherein the instructions are further executable by the at least one processor to cause the computer-based system to generate a display of the respective simulated deformation in the web-based application.

15. The computer-based system of claim 14, wherein generating the display comprises generating the display in response to a request to generate the display.

16. An article of manufacture including a non-transitory computer-readable medium, having stored therein program instructions that, upon execution by a computing device, cause the computing device to perform functions comprising:
causing a force to be applied to an object to cause a deformation of the object;
during the deformation of the object, causing a plurality of reference scans of the object to be captured;
determining a three-dimensional (3D) object data model representing the object, wherein the 3D object data model is determined based at least in part on the plurality of reference scans;
identifying a constraint point of the 3D object data model, wherein the constraint point represents a point within a predetermined range of a point of minimum deformation of the object; and
determining, by the one or more computing devices, a predefined deformation model that defines a simulated deformation simulating at least a portion of the deformation of the object based on the constraint point;
receiving a request to generate a respective simulated deformation of the object based on a particular force;
selecting, from a plurality of force models, at least one force model for the object based on the particular force, wherein a respective force model includes information indicative of a force, a constraint point on the 3D object data model, and reference to a deformation model for the constraint point of the object; and
generating, by the one or more computing devices, the respective simulated deformation of the object based on the selected force model, wherein the respective simulated deformation includes a representation of a visualization of deformation of the object.

17. The article of manufacture of claim 16, wherein the force comprises at least one of a linear force or a centrifugal force.

18. The article of manufacture of claim 16, the functions further comprising:
generating, the plurality of force models for the 3D object data model, wherein the plurality of force models comprise information indicative of the force, the constraint point, and the predefined deformation model selected for the constraint point; and
storing the generated force models in a database.

19. The article of manufacture of claim 18, the functions further comprising:
receiving a request to generate the respective simulated deformation; and
generating the respective simulated deformation using a generated force model.

\* \* \* \* \*